(12) United States Patent
Oshima et al.

(10) Patent No.: US 8,303,064 B2
(45) Date of Patent: Nov. 6, 2012

(54) CAPACITIVE LOAD DRIVING CIRCUIT, LIQUID EJECTION DEVICE, AND PRINTING APPARATUS

(75) Inventors: Atsushi Oshima, Shiojiri (JP); Kunio Tabata, Shiojiri (JP); Shinichi Miyazaki, Suwa (JP); Hiroyuki Yoshino, Matsumoto (JP); Noritaka Ide, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 303 days.

(21) Appl. No.: 12/839,765

(22) Filed: Jul. 20, 2010

(65) Prior Publication Data

US 2011/0018919 A1    Jan. 27, 2011

(30) Foreign Application Priority Data

Jul. 21, 2009    (JP) .................................. 2009-169798

(51) Int. Cl.
    *B41J 29/38*    (2006.01)
(52) U.S. Cl. .............................................. 347/9; 347/10
(58) Field of Classification Search ........................ None
    See application file for complete search history.

(56) References Cited

U.S. PATENT DOCUMENTS

2008/0238964 A1    10/2008 Umeda

FOREIGN PATENT DOCUMENTS

| JP | 7-130484 | | 5/1995 |
|----|----------|---|--------|
| JP | 2002-067304 | A | 3/2002 |
| JP | 2004-336904 | A | 11/2004 |
| JP | 2005-102375 | A | 4/2005 |
| JP | 2006-280160 | A | 10/2006 |
| JP | 2008-238641 | A | 10/2008 |

*Primary Examiner* — Stephen Meier
*Assistant Examiner* — Tracey McMillion
(74) *Attorney, Agent, or Firm* — Maschoff Gilmore & Israelsen

(57) ABSTRACT

A capacitive load driving circuit that drives a capacitive load, includes: a power supply unit that generates different voltages; a plurality of charge storage elements that are charged with the different voltages generated by the power supply unit; and a load driving section that connects a charge storage element arbitrarily selected from the plurality of charge storage elements to the capacitive load to drive the capacitive load, and connects, when at least two of the charge storage elements are selected, the at least two charge storage elements to the capacitive load in a state where the at least two charge storage elements are connected in series.

7 Claims, 14 Drawing Sheets

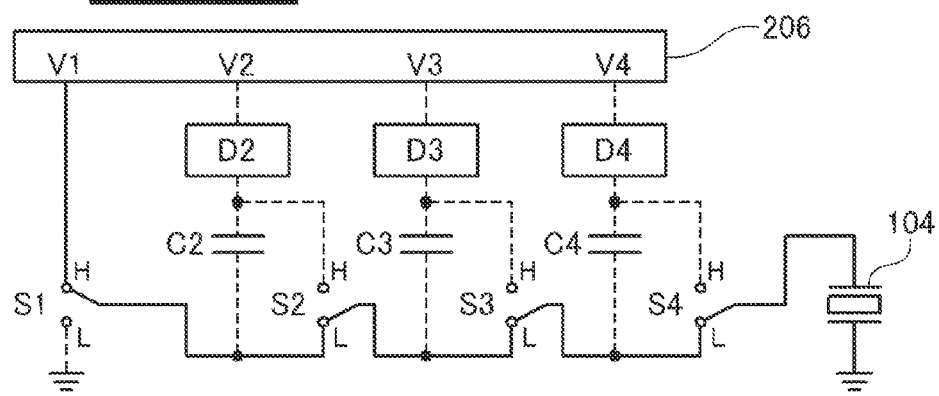
FIG. 5A WHEN APPLYING V1
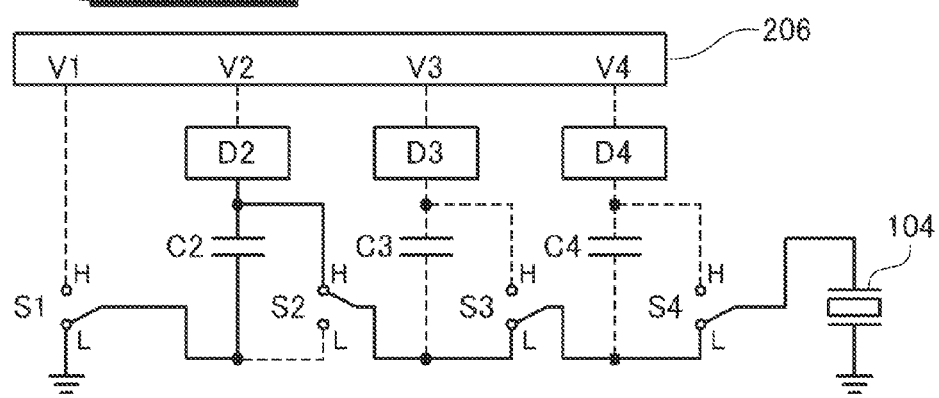
FIG. 5B WHEN APPLYING V2
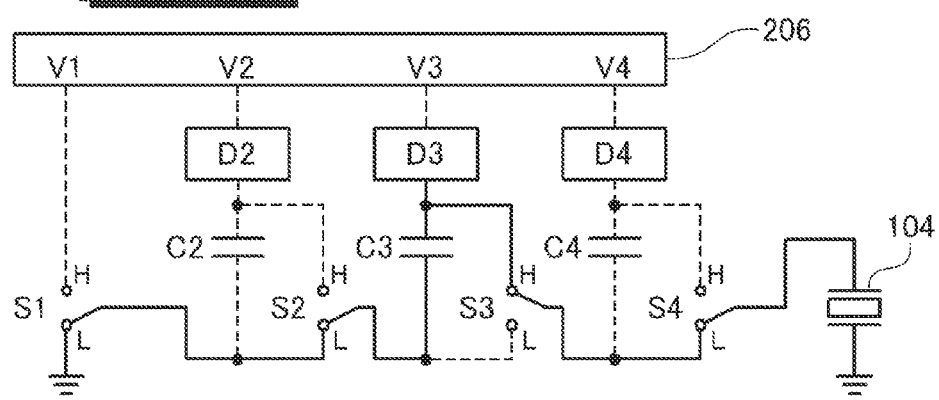
FIG. 5C WHEN APPLYING V3

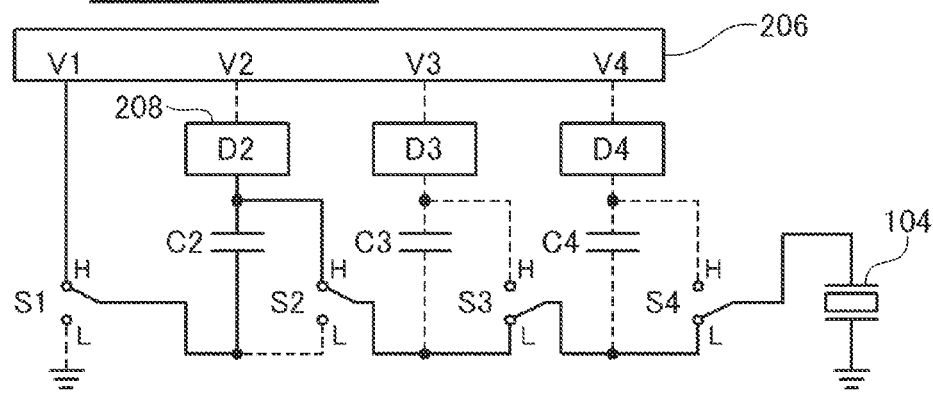
FIG. 6A WHEN APPLYING V1+V2
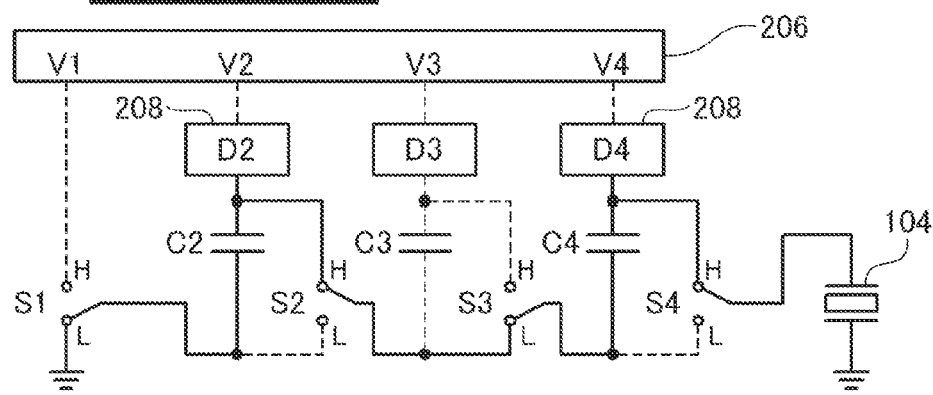
FIG. 6B WHEN APPLYING V2+V4
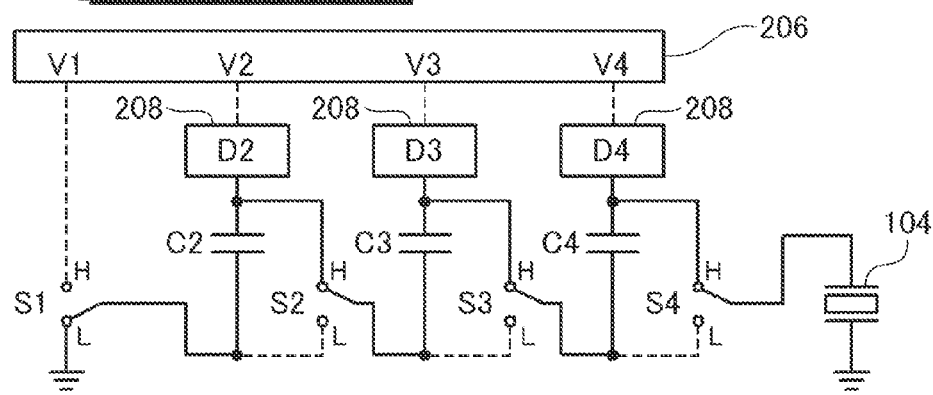
FIG. 6C WHEN APPLYING V2+V3+V4

| COUNT VALUE | DATA | S4 | S3 | S2 | S1 |
|---|---|---|---|---|---|
| 0 | 6 | L | H | H | L |
| 1 | 6 | L | H | H | L |
| 2 | 7 | L | H | H | H |
| 3 | 8 | H | L | L | L |
| 4 | 9 | H | L | L | H |
| 5 | 10 | H | L | H | L |
| 6 | 11 | H | L | H | H |
| 7 | 12 | H | H | L | L |
| 8 | 13 | H | H | L | H |
| 9 | 14 | H | H | H | L |
| 10 | 15 | H | H | H | H |
| 11 | 15 | H | H | H | H |
| 12 | 13 | H | H | L | H |
| 13 | 11 | H | L | H | H |
| 14 | 9 | H | L | L | H |
| 15 | 7 | L | H | H | H |
| 16 | 5 | L | H | L | H |
| 17 | 3 | L | L | H | H |
| 18 | 1 | L | L | L | H |
| 19 | 1 | L | L | L | H |
| 20 | 1 | L | L | L | H |
| 21 | 1 | L | L | L | H |
| 22 | 2 | L | L | H | L |
| 23 | 3 | L | L | H | H |
| 24 | 4 | L | H | L | L |
| 25 | 5 | L | H | L | H |
| 26 | 6 | L | H | H | L |
| 27 | 6 | L | H | H | L |
| 28 | 6 | L | H | H | L |
| 29 | 6 | L | H | H | L |

FIG.11

CAPACITIVE LOAD DRIVING CIRCUIT, LIQUID EJECTION DEVICE, AND PRINTING APPARATUS

CROSS-REFERENCE

This application claims priority to Japanese Patent Application No. 2009-169798, filed on Jul. 21, 2009, the entirety of which is hereby incorporated by reference.

BACKGROUND

1. Technical Field

The present invention relates to a technique of driving an electrical load having a capacitive component (capacitive load).

2. Related Art

JP-A-7-130484 discloses a technique in which a plurality of capacitors connected in parallel are previously charged by using a power supply and the capacitors are switched from parallel connection to series connection as needed to generate a voltage higher than a voltage of the power supply, thereby driving an electrical load. By using the proposed technique, it is possible to generate a voltage many times higher than a voltage generated by the power supply according to the number of capacitors connected in series and apply the voltage to the electrical load.

In the proposed technique, however, it is difficult to expand an applicable voltage range as well as to improve the resolution of voltage change. When the voltage to be charged to the capacitor is increased for expanding the applicable voltage range, the resolution of voltage change decreases. Therefore, it is difficult to change the applied voltage in small steps. When the voltage to be charged to the capacitor is decreased for enhancing the resolution of voltage change, the applicable voltage range becomes narrow. It is apparent that when many capacitors are prepared to be connected in series, the applicable voltage range can be expanded while keeping the voltage to be charged to the capacitor low (that is, while keeping the resolution of voltage change high). However, this increases the size of a driving circuit because of a great increase in the number of capacitors.

SUMMARY

An advantage of some aspects of the invention is to provide a technique capable of simultaneously realizing the expansion of a voltage range that can be applied to a capacitive load and the improvement of the resolution of voltage change with a small driving circuit.

The invention can be implemented with the following configuration.

An aspect of the invention is directed to a capacitive load driving circuit that drives a capacitive load, including: a power supply unit that generates different voltages; a plurality of charge storage elements that are charged with the different voltages generated by the power supply unit; and a load driving section that connects a charge storage element arbitrarily selected from the plurality of charge storage elements to the capacitive load to drive the capacitive load, and connects, when at least two of the charge storage elements are selected, the at least two charge storage elements to the capacitive load in a state where the at least two charge storage elements are connected in series.

According to the capacitive load driving circuit of the aspect of the invention, it is possible to drive the capacitive load with different voltages depending on which charge storage element is selected from the plurality of charge storage elements charged with the different voltages. By changing the charge storage element to be selected, the voltage to be applied to the capacitive load can be changed. When at least two of the charge storage elements are selected, the charge storage elements can be connected to the capacitive load in a state where the charge storage elements are connected in series. Therefore, the voltage to be applied to the capacitive load can be varied depending on a combination of the charge storage elements to be selected. As a result, it is possible to increase the kinds of applicable voltages and expand an applicable voltage range. Nevertheless, since the number of charge storage elements does not have to be increased, a driving circuit of the capacitive load can be miniaturized.

In the capacitive load driving circuit according to the aspect of the invention, a back-flow preventing unit that prevents the back flow of charge from the charge storage element to the power supply unit may be inserted between the power supply unit and the charge storage element.

In the capacitive load driving circuit according to the aspect of the invention, since the plurality of charge storage elements are connected to the capacitive load in the state where the charge storage elements are connected in series, the voltage of the charge storage elements may exceed the voltage of the power supply unit when the plurality of charge storage elements are connected in series. However, by inserting the back-flow preventing unit between the charge storage element and the power supply unit, it is possible to avoid the occurrence of back flow of charge from the charge storage element to the power supply unit.

In the capacitive load driving circuit according to the aspect of the invention, the plurality of voltages generated by the power supply unit may be the following voltages. That is, a total voltage of at least two of the plurality of voltages generated by power supply unit may not coincide with one remaining voltage of the plurality of voltages. When there are a plurality of remaining voltages, the total voltage of the at least two voltages may not coincide with a total voltage of at least two voltages included in the remaining voltages.

In the case where the plurality of voltages generated by the power supply unit satisfy the relation, even when any combination of the voltages is selected, the voltage does not overlap another voltage or a combination of other voltages. Therefore, it is possible to most effectively increase the kinds of applicable voltages and to most effectively expand an applicable voltage range.

In the capacitive load driving circuit according to the aspect of the invention in which the plurality of voltages generated by the power supply unit satisfy the above-described relation, the plurality of voltages may be set to a plurality of voltages $2^n$ times a minimum voltage.

With this setting, the plurality of voltages that satisfy the above-described relation can be simply set. In addition, a plurality of voltage values obtained by combining the voltages are equally spaced from one another. Therefore, any drive waveform can be properly generated, which is preferable.

BRIEF DESCRIPTION OF THE DRAWINGS

The invention will be described with reference to the accompanying drawings, wherein like numbers reference like elements.

FIGS. 5A to 5C are explanatory views exemplifying a state of applying a voltage arbitrarily selected from voltages V1 to V4 to a piezo element.

FIGS. 6A to 6C are explanatory views exemplifying a state of applying a plurality of voltages arbitrarily selected from the voltages V1 to V4 to the piezo element.

FIG. 11 is a table exemplifying waveform data stored in a memory of the printer control circuit.

DESCRIPTION OF EXEMPLARY EMBODIMENTS

Hereinafter, an embodiment will be described for making clear the contents of the invention in the following order.

Figure 1:
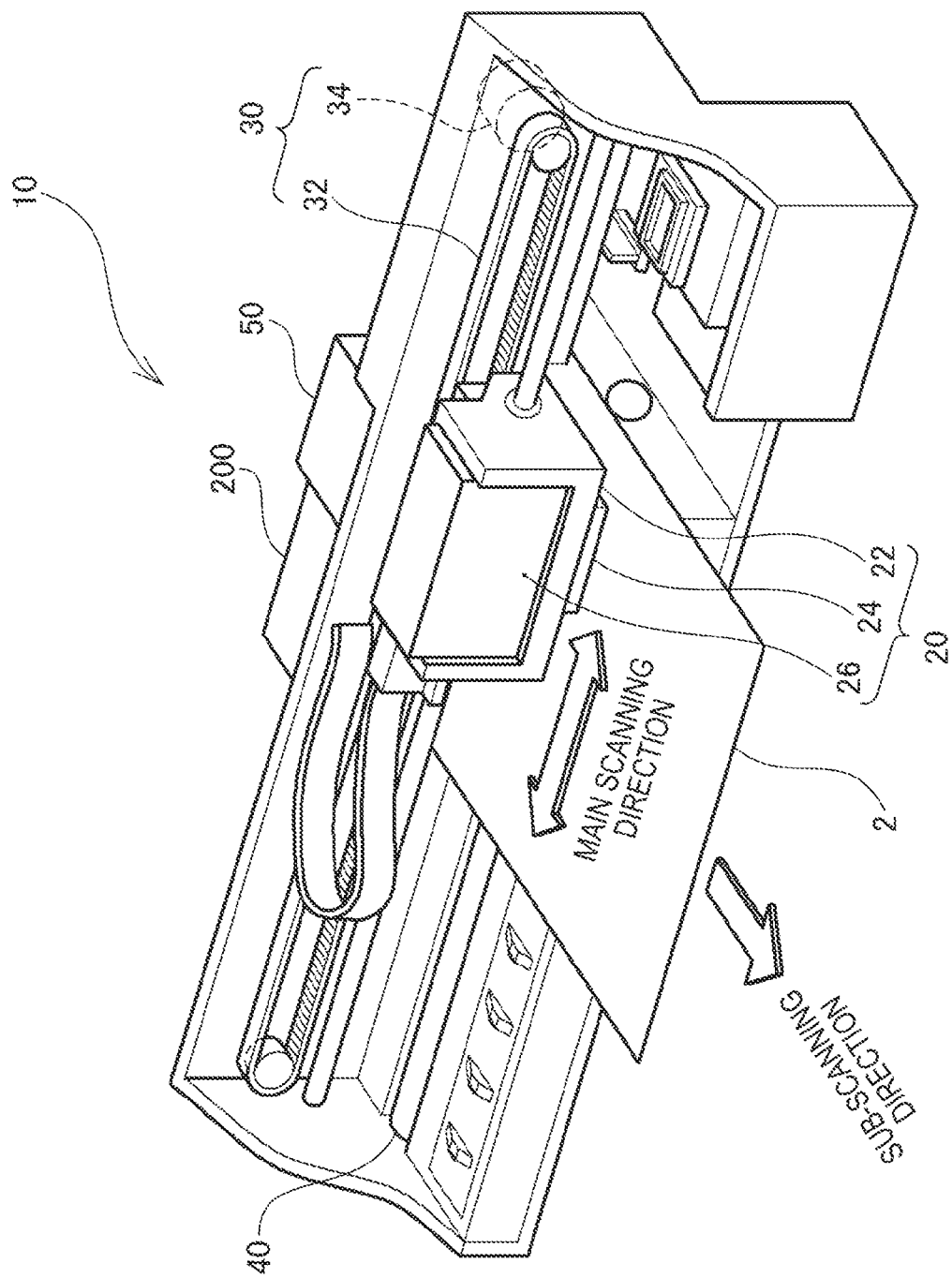
FIG. 1 is an explanatory view exemplifying an inkjet printer on which an ejection head driving circuit of an embodiment is mounted.

A. Device Configuration
B. Peripheral Circuit Configuration of Ejection Head Driving Circuit
  B-1. Configuration of Ejection Head Driving Circuit
  B-2. Principle of Generating Applied Voltage
  B-3. Method for Generating Drive Waveform
C. Modified Examples
  C-1. First Modified Example
  C-2. Second Modified Example
  C-3. Third Modified Example A. Device Configuration FIG. 1 is an explanatory view exemplifying an inkjet printer 10 on which an ejection head driving circuit as a capacitive load driving circuit of the embodiment is mounted. The illustrated inkjet printer 10 includes a carriage 20 that forms an ink dot on a print medium 2 while reciprocating in a main scanning direction, a drive mechanism 30 that makes the carriage 20 reciprocate, and a platen roller 40 for feeding the print medium 2. The carriage 20 is provided with an ink cartridge 26 accommodating ink therein, a carriage case 22 into which the ink cartridge 26 is loaded, an ejection head 24 that is mounted on the bottom side (side facing the print medium 2) of the carriage case 22 to eject ink, and the like. The carriage 20 can guide the ink in the ink cartridge 26 to the ejection head 24 and eject an accurate amount of ink from the ejection head 24 to the print medium 2.

The drive mechanism 30 that makes the carriage 20 reciprocate includes a timing belt 32 that is stretched by a pulley and a step motor 34 that drives the timing belt 32 via the pulley. A part of the timing belt 32 is fixed to the carriage case 22 so that it is possible to make the carriage case 22 reciprocate by driving the timing belt 32. The platen roller 40, a not-shown driving motor, and a gear mechanism constitute a paper feeding mechanism of the print medium 2, which feeds the print medium 2 in a sub-scanning direction at a predetermined amount.

The inkjet printer 10 also has a printer control circuit 50 that controls the entire operation and an ejection head driving circuit 200 for driving the ejection head 24 mounted thereon. The ejection head driving circuit 200, the drive mechanism 30, the paper feeding mechanism, and the like drive the ejection head 24 to eject ink while feeding the print medium 2 under the control of the printer control circuit 50, thereby printing an image on the print medium 2.

B. Peripheral Circuit Configuration of Ejection Head Driving Circuit

Figure 2:
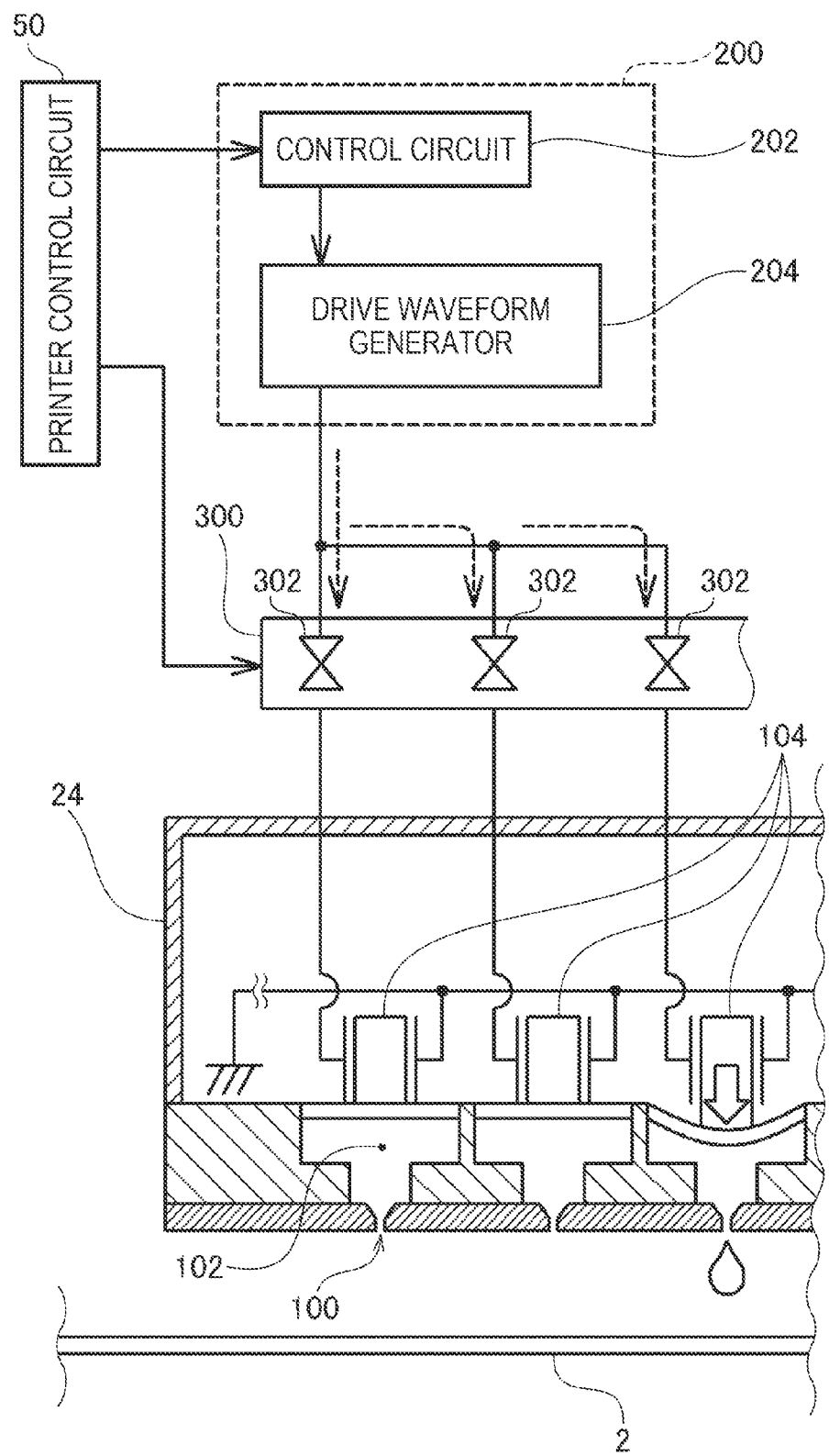
FIG. 2 is an explanatory view showing the peripheral circuit configuration of the ejection head driving circuit.

FIG. 2 is an explanatory view showing the peripheral circuit configuration of the ejection head driving circuit 200 that drives the ejection head 24. At the periphery of the ejection head driving circuit 200, the printer control circuit 50, a later-described gate unit 300, and the like are provided. The ejection head driving circuit 200 is connected to the ejection head 24 via the gate unit 300. Before describing these circuit configurations, the inner structure of the ejection head 24 will be briefly described.

On the bottom surface (surface facing the print medium 2) of the ejection head 24, a plurality of nozzles 100 that eject ink drops are disposed. Each of the nozzles 100 is connected to an ink chamber 102 in which ink supplied from the ink cartridge 26 is filled. A piezo element 104 is disposed on each of the ink chambers 102. When voltage is applied to the piezo element 104, the piezo element is deformed to operate as an actuator and pressurize the ink chamber 102, whereby an ink drop is ejected from the nozzle 100. Since the deformation amount of the piezo element 104 varies depending on an applied voltage, when the deformation amount or timing of the ink chamber 102 is controlled by applying a proper voltage waveform, an ink drop having a proper size can be ejected at a proper timing.

A voltage waveform (drive waveform) to be applied to the piezo element 104 is generated by the ejection head driving circuit 200 under the control of the printer control circuit 50 and thereafter supplied to the piezo element 104 via the gate unit 300. The gate unit 300 is a circuit unit in which a plurality of gate elements 302 are connected in parallel. The gate elements 302 can be individually brought into a conductive state or a disconnected state under the control of the printer control circuit 50. Accordingly, when a drive waveform is output from the ejection head driving circuit 200, the drive waveform passes through only the gate element 302 that has been previously set to the conductive state by the printer control circuit 50 and is applied to the corresponding piezo element 104, whereby an ink drop is ejected from the nozzle of the corresponding piezo element.

As shown in FIG. 2, the ejection head driving circuit 200 of the embodiment includes a control circuit 202 and a drive waveform generator 204. When the printer control circuit 50 commands the ejection head driving circuit 200 to output a drive waveform, the control circuit 202 controls the operation of the drive waveform generator 204 in response to the command, whereby a proper drive waveform is output from the ejection head driving circuit 200.

In this case, a piezo element is a so-called capacitive load as has been well known. When voltage is applied, charge corresponding to the applied voltage is stored inside the piezo element. The charge amount stored therein increases as the applied voltage increases. On the other hand, when the applied voltage decreases, the charge amount stored therein decreases, whereby the charge is discharged. Therefore, the charge discharged from the piezo element when the applied voltage decreases is stored in a plurality of capacitors (charge storage elements), and the charge stored in the capacitors is supplied to the piezo element when the voltage to be next applied increases, whereby the piezo element can be efficiently driven with less power. In the ejection head driving circuit 200 of the embodiment, for realizing the ejection head driving circuit 200 that is small and capable of applying to the piezo element 104 a drive waveform whose applied voltage range is sufficiently wide and whose voltage change is sufficiently smooth, the piezo element 104 is driven by the following method.

B-1. Configuration of Ejection Head Driving Circuit

Figure 3:
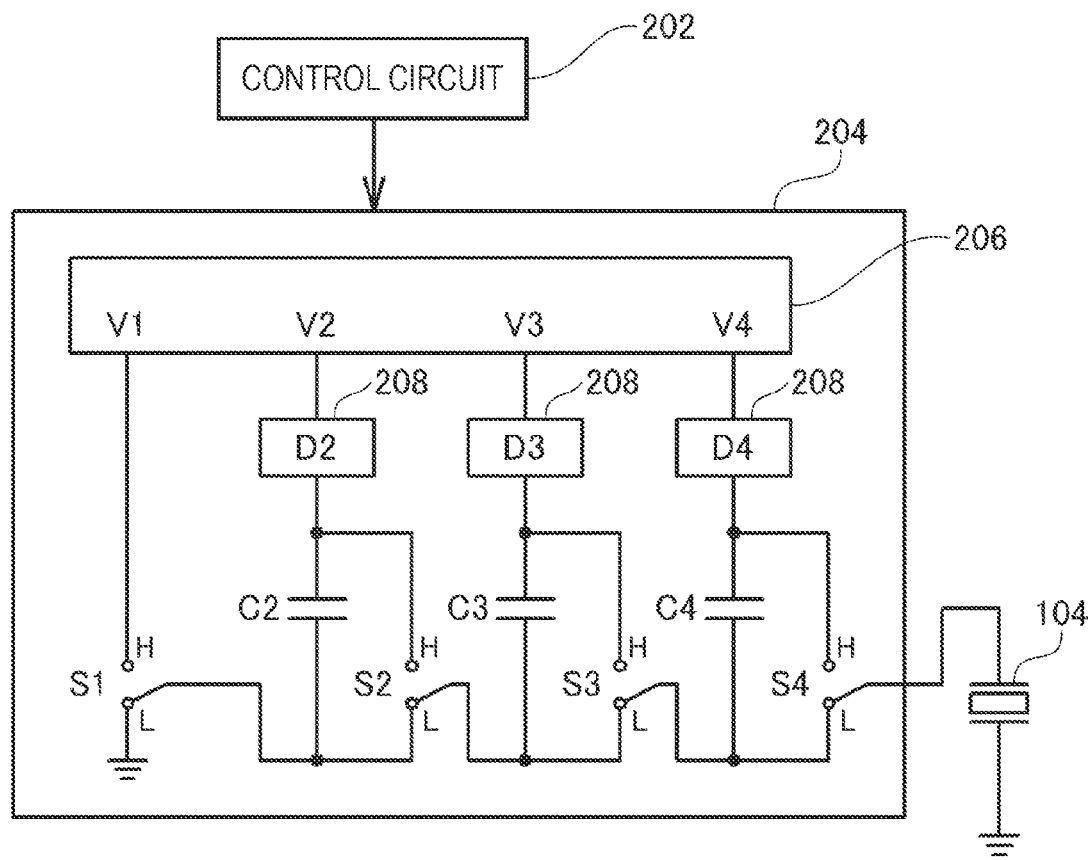
FIG. 3 is an explanatory view showing the detailed configuration of the ejection head driving circuit of the embodiment.

FIG. 3 is an explanatory view showing the detailed configuration of the ejection head driving circuit 200 of the embodiment. The ejection head driving circuit 200 includes the control circuit 202 and the drive waveform generator 204. The drive waveform generator 204 includes a plurality of capacitors, a power supply unit 206 that charges the capacitors, and a plurality of switches. The control circuit 202 controls the connection of the switches. In the example shown in FIG. 3, although three capacitors of capacitors C2 to C4 are used, more capacitors may be used. Moreover, although the piezo element 104 disposed in the ejection head 24 of the inkjet printer 10 is shown as an electrical load to be driven, any electrical load (for example, various display devices such as liquid crystal display devices) is applicable as long as it is an electrical load having a capacitive component (capacitive load).

One terminal of each of the three capacitors C2 to C4 of the drive waveform generator 204 is connected to the power supply unit 206. The power supply unit 206 generates four different voltages of voltage V1, voltage V2, voltage V3, and voltage V4 (in the example, V1<V2<V3<V4). The highest voltage V4 is connected to the capacitor C4. The next highest voltage V3 is connected to the capacitor C3. The next highest voltage V2 is connected to the capacitor C2. For preventing the back flow of current from the capacitor side to the power supply unit, a back-flow preventing unit 208 is inserted between each of the capacitors C2 to C4 and the power supply unit 206. In the embodiment, although a diode is used as the back-flow preventing unit 208, a switch may be used.

Switches S2 to S4 are connected in parallel to the capacitors C2 to C4, respectively. Each of the switches S2 to S4 can switch between an H state and an L state and includes a terminal on the H side, a terminal on the L side, and a common terminal. When the switch is switched to the H state, the terminal on the H side and the common terminal are electrically conducted. When the switch is switched to the L state, the terminal on the L side and the common terminal are electrically conducted.

The terminal of each of the switches S2 to S4 on the H side is connected to a terminal of the corresponding capacitor on the power supply unit side (high potential side). The terminal of each of the switches S2 to S4 on the L side is connected to the low potential side of the corresponding capacitor. The common terminal of the switch S2 connected in parallel to the capacitor C2 is connected to the low potential side of the capacitor C3. Accordingly, when the switch S2 is switched to the L state, the low potential side of the two capacitors C2 and C3 can be brought into the conductive state. Similarly, the common terminal of the switch S3 connected in parallel to the capacitor C3 is connected to the low potential side of the capacitor C4. Accordingly, when the switch S3 is switched to the L state, the terminal of the capacitor C3 on the low potential side and the terminal of the capacitor C4 on the low potential side can be brought into the conductive state.

Further, the common terminal of the switch S4 connected in parallel to the capacitor C4 is connected to the piezo element 104 via the gate unit 300. In FIG. 3, the gate unit 300 is not illustrated. Separately from the three switches S2 to S4 connected in parallel to the capacitors C2 to C4, one more switch S1 is disposed. Also the switch S1 can switch between the H state and the L state. A terminal of the switch S1 on the H side is connected to the power supply unit 206 of the voltage V1, a terminal on the L side is connected to a ground, and a common terminal is connected to the low potential side of the capacitor C2. Accordingly, when the switch S1 is switched to the L state, the terminal of the capacitor C2 on the low potential side can be connected to a ground.

B-2. Principle of Generating Applied Voltage

For driving a load by using the drive waveform generator 204 of the embodiment, it is necessary to previously charge the capacitors C2 to C4. Therefore, the connection states of the switches S1 to S4 are switched to connect the capacitors C2 to C4 to the power supply unit 206. In this case, the capacitor C2 is connected to the power supply unit 206 of the voltage V2, the capacitor C3 is connected to the power supply unit 206 of the voltage V3, and the capacitor C4 is connected to the power supply unit 206 of the voltage V4.

Figure 4:
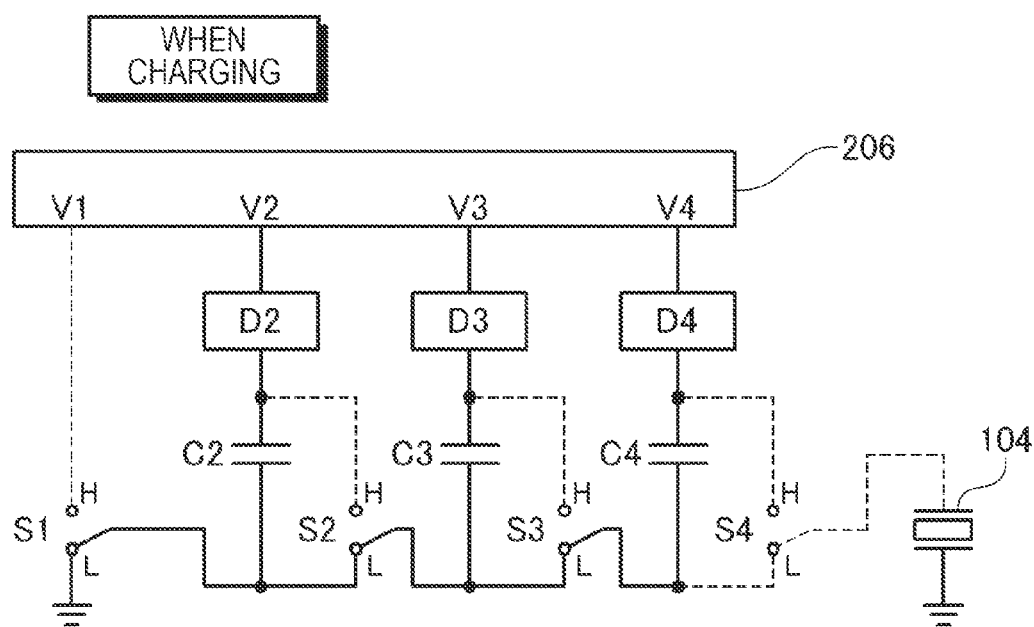
FIG. 4 is an explanatory view showing the connection states of switches S1 to S4 when capacitors C2 to C4 are charged.

FIG. 4 is an explanatory view showing the connection states of the switches S1 to S4 when the capacitors C2 to C4 are charged. For charging the capacitors C2 to C4, all the connection states of the switches S1 to S4 are switched to the L state. Then, the terminal of the capacitor C2 on the low potential side is connected to a ground via the switch S1, the terminal of the capacitor C3 on the low potential side is connected to a ground via the switches S2 and S1, and the terminal of the capacitor C4 on the low potential side is connected to a ground via the switches S3, S2, and S1. As described above, the terminal of the capacitor C2 on the high potential side is connected to the power supply unit 206 of the voltage V2, the terminal of the capacitor C3 on the high potential side is connected to the power supply unit 206 of the voltage V3, and the terminal of the capacitor C4 on the high potential side is connected to the power supply unit 206 of the voltage V4. Therefore, the voltages V2 to V4 can be charged to the capacitors C2 to C4, respectively. In FIG. 4, wires in the conductive state are indicated by bold solid lines, and wires not in the conductive state are indicated by thin broken lines.

The drive waveform generator 204 of the embodiment charges the capacitors C2 to C4 with the voltages V2 to V4 in this manner and switches the connection states of the switches S1 to S4, making it possible to apply to the piezo element 104 a voltage arbitrarily selected from the voltages V1 to V4 or a combination of voltages arbitrarily selected.

FIGS. 5A to 5C are explanatory views exemplifying a state where a voltage arbitrarily selected from the voltages V1 to V4 is applied to the piezo element 104. As shown in FIG. 5A for example, when only the switch S1 is brought into the H state, and the other switches S2 to S4 are brought into the L state, the voltage V1 is applied to the piezo element 104. As shown in FIG. 5B, when only the switch S2 is brought into the H state, and the other switches S1, S3, and S4 are brought into the L state, the voltage V2 stored in the capacitor C2 is applied to the piezo element 104. When it is intended to apply the voltage V3 to the piezo element 104, only the switch S3 is brought into the H state, and the other switches S1, S2, and S4 are brought into the L state as shown in FIG. 5C. Similarly, when it is intended to apply the voltage V4, only the switch S4 is brought into the H state, and the other switches S1 to S3 are brought into the L state.

As described above, when it is intended to apply one voltage alone selected from the voltages V1 to V4 to the piezo element 104, only the switch corresponding to the voltage is brought into the H state, and the other switches remain in the L state. Therefore, the voltage can be applied to the piezo element 104. It is also possible to combine a plurality of voltages selected from the voltages V1 to V4 to thereby apply the combined voltage to the piezo element 104.

FIGS. 6A to 6C are explanatory views exemplifying a state of applying a plurality of voltages arbitrarily selected from the voltages V1 to V4 to the piezo element 104. As shown in FIG. 6A for example, when the switch S1 and the switch S2 are brought into the H state, and the other switches S3 and S4 are brought into the L state, a voltage of the capacitor C2 on the low potential side becomes V1, and a voltage of the capacitor C2 on the high potential side becomes V1+V2, whereby the voltage V1+V2 is connected to the piezo element 104. In this case, the voltage of the capacitor C2 on the high potential side is higher than the voltage V2 of the power supply unit 206 to be charged to the capacitor C2. As described above, however, by inserting the back-flow preventing unit 208 between the capacitor C2 and the power supply unit 206, current does not flow back from the capacitor C2 toward the power supply unit 206.

As shown in FIG. 6B, when the switch S2 and the switch S4 are brought into the H state, and the other switches S1 and S3 are brought into the L state, the capacitor C2 and the capacitor C4 are brought into a state where they are connected in series. Therefore, a total voltage V2+V4 stored in the capacitors C2 and C4 is applied to the piezo element 104. Further as shown in FIG. 6C, when the switch S2, the switch S3, and the switch S4 are brought into the H state, and the other switch S1 is brought into the L state, the capacitors C2 to C4 are brought into a state where they are connected in series. Therefore, a voltage V2+V3+V4 obtained by adding up the voltages of the capacitors C2 to C4 is applied to the piezo element 104. Also in these cases, by inserting the back-flow preventing unit 208 between each of the capacitors C3 and C4 and the power supply unit 206, current does not flow back from the capacitors C3 and C4 toward the power supply unit 206.

As is apparent from the above description, in the drive waveform generator 204 of the embodiment, an arbitrary voltage or a combination of arbitrary voltages can be selected from the voltages V1 to V4 by switching the connection states of the switches S1 to S4 to thereby apply the voltage to the piezo element 104. That is, the switch S1, the switch S2, the switch S3, and the switch S4 are previously associated with the voltage V1, the voltage V2, the voltage V3, and the voltage V4, respectively. One or a plurality of voltages are selected from the voltages V1 to V4, the switch (es) corresponding to the voltage (s) is/are brought into the H state, and the other switch (es) is/are brought into the L state. Therefore, the selected voltage or combination of voltages can be applied to the piezo element 104.

In the drive waveform generator 204 of the embodiment, the plurality of voltages V1, V2, V3, and V4 generated by the power supply unit 206 are not simply set to different voltages. The plurality of voltages are set such that even when the plurality of voltages are selected in any combination, the total of the voltages does not coincide with any of the remaining voltages or any total of the remaining voltages. For example, when the ratio of the voltages is V1:V2:V3:V4=1:2:3:4, although the voltages are set to different voltages from one another, a total value of V1 and V2 coincides with V3, or a total value of V2 and V3 coincides with a total value of V1 and V4. On the other hand, when the ratio of the voltages is V1:V2:V3:V4=1:1.5:4.5:8, a total value of any combination of the voltages does not coincide with the other voltages, and does not coincide with a total value of any combination of the voltages. In the drive waveform generator 204 of the embodiment, since the plurality of voltages generated by the power supply unit 206 are set to the voltages V1, V2, V3, and V4 having such a relation, it is possible to generate a great number of voltages as shown below.

Figure 7A:
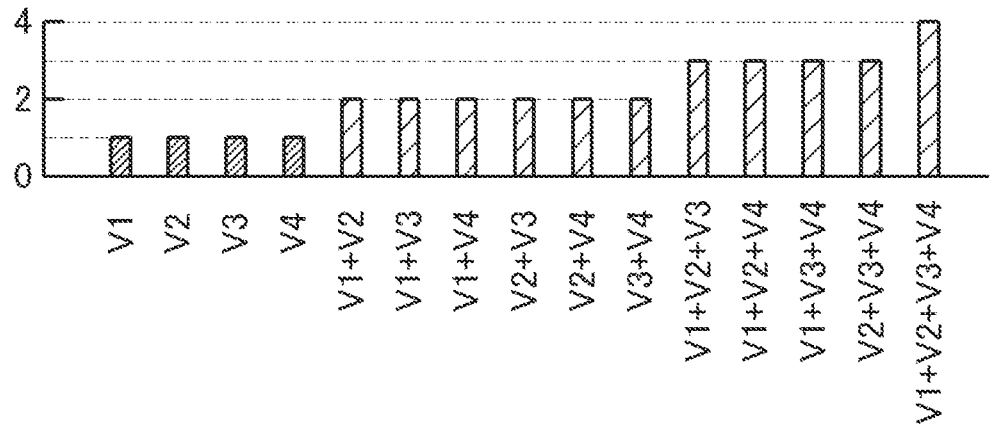
FIGS. 7A and 7B are graphs showing the reason why many voltages can be generated by varying a voltage generated by the power supply unit.
Figure 7B:
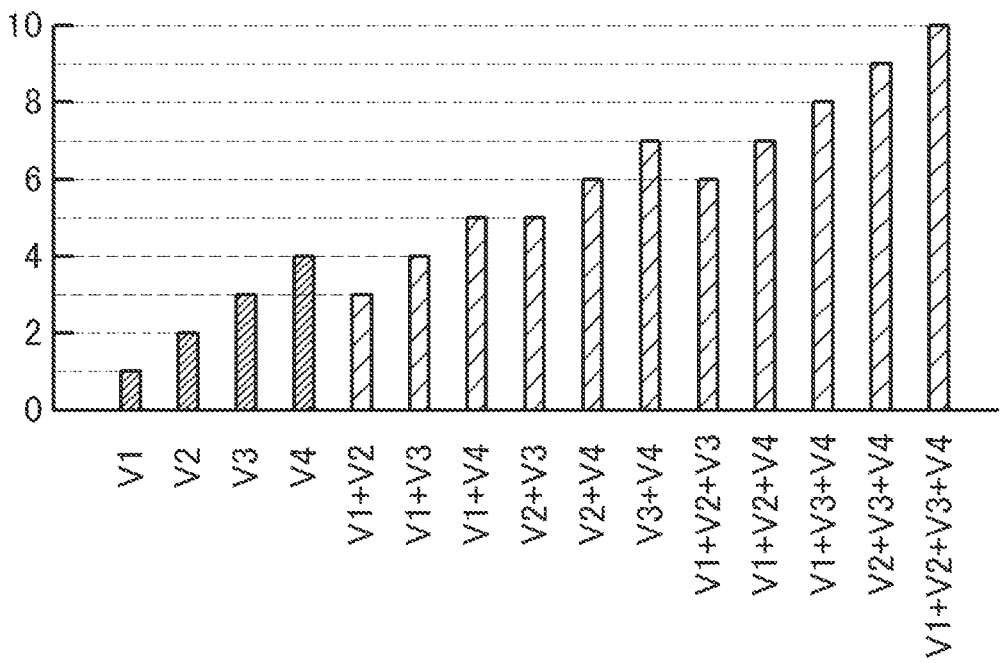

FIGS. 7A and 7B are graphs showing the reason why many voltages can be generated by varying the voltage generated by the power supply unit 206. The horizontal axis in FIGS. 7A and 7B represents voltage (or combination of voltages) selected from the voltages V1 to V4, while the vertical axis in FIGS. 7A and 7B represents how many times the voltage obtained by selecting the voltages V1 to V4 is higher than the minimum voltage V1. For distinguishing between the voltages V1 to V4 generated by the power supply unit 206 and the voltages generated by combining the voltages V1 to V4, the voltages V1 to V4 generated by the power supply unit 206 are shown hatched finely in the drawings.

For comparison, FIG. 7A shows the case where the voltages V1 to V4 generated by the power supply unit 206 are the same (V1:V2:V3:V4=1:1:1:1). In this case, even when any of the voltages V1 to V4 is selected, a voltage to be applied to the piezo element 104 is the same as the voltage V1. When two voltages in any combination are selected, a voltage twice the voltage V1 is obtained. Similarly, in the case of selecting three voltages, even when any combination is selected from the voltages V1 to V4, a voltage three times the voltage V1 is obtained. When all the voltages V1 to V4 are selected, a voltage four times the voltage V1 is obtained. In the end, when all the voltages V1 to V4 generated by the power supply unit 206 are set the same, four level voltages of the voltage V1, voltage 2V1, voltage 3V1, and voltage 4V1 can be generated.

On the other hand, FIG. 7B shows the case where the voltages V1 to V4 generated by the power supply unit 206 are all different (V1:V2:V3:V4=1:2:3:4). In this case, when two voltages are selected from the voltages V1 to V4, obtained voltages have different values depending on a combination of the selected voltages. Similarly, in the case of selecting three voltages, obtained voltages have different values depending on a combination of the selected voltages. As a result, the number of voltage levels that can be generated increases to 10 levels, and a voltage range that can be generated is expanded to 10 times the voltage V1. In this manner, in the drive waveform generator 204 of the embodiment, a voltage arbitrarily selected from the plurality of voltages V1 to V4 or a combination of plurality of voltages arbitrarily selected can be applied to the piezo element 104. Therefore, only by varying the plurality of voltages V1 to V4, the kinds of applicable voltages can be greatly increased, and also an applicable voltage range can be greatly expanded.

However, it can be seen by close inspection of FIG. 7B that there is the case where the obtained voltage overlaps another voltage or a combination of voltages depending on a combination of the selected voltages. For example, a voltage obtained by selecting the voltage V1 and the voltage V2 overlaps a voltage obtained by the voltage V3 alone. A voltage obtained by selecting the voltage V1 and the voltage V4 overlaps a voltage obtained by selecting the voltage V2 and the voltage V3. Other than these cases, there are plural combinations where the obtained voltage overlaps another voltage. If the obtained voltage is made different from another voltage in the combinations where the voltage overlaps another voltage as described above, it should be possible to increase the number of voltage levels that can be generated more than 10 levels. In the drive waveform generator 204 of the embodiment, therefore, the voltages V1 to V4 are set to such values that even when a plurality of voltages in any combination are selected from the four voltages V1 to V4 generated by the power supply unit 206, the total of the voltages does not coincide with any of the remaining voltages or any total of the remaining voltages.

Figure 8:
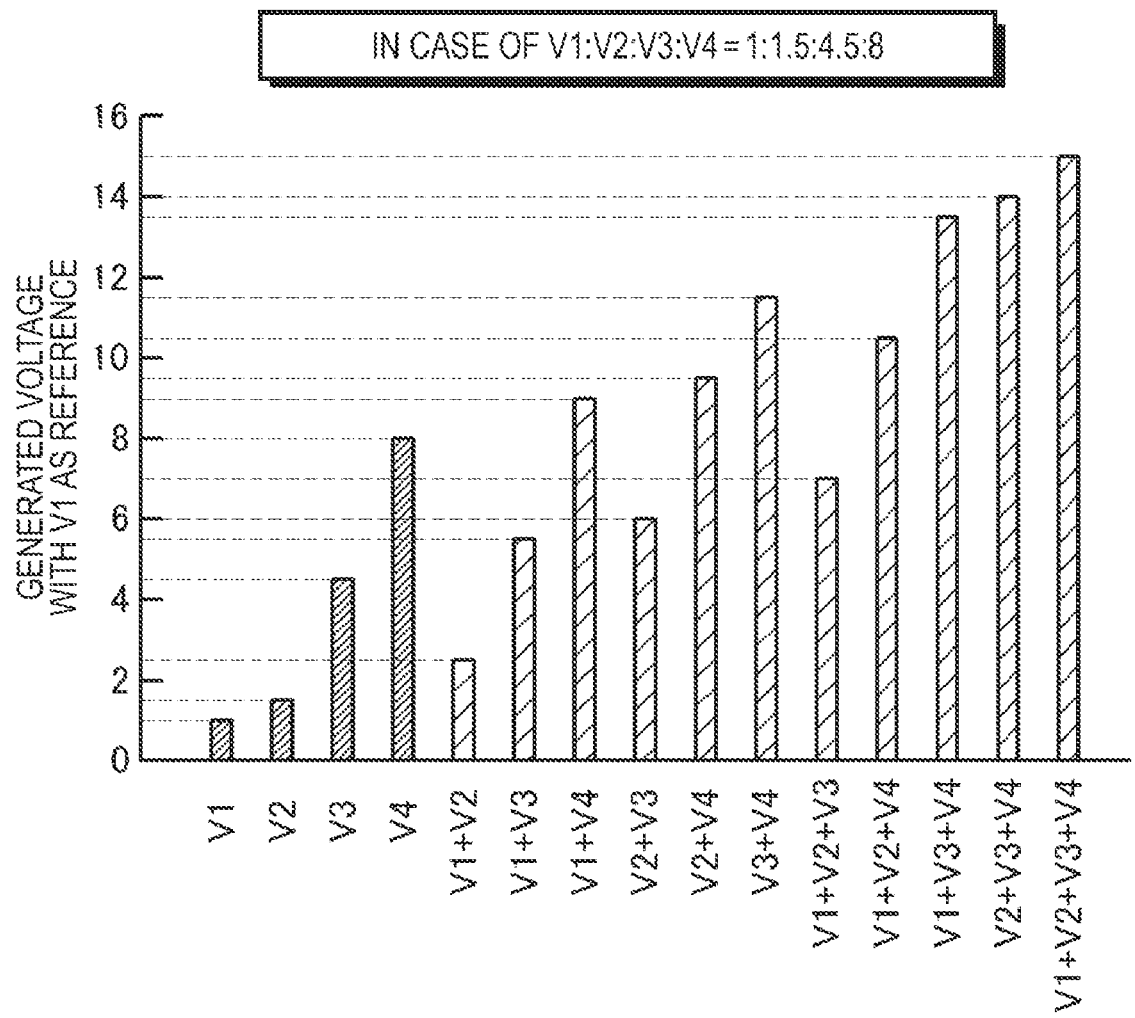
FIG. 8 is a graph showing a plurality of voltages that can be generated in the case where the voltages V1 to V4 are set to such values that even when a plurality of voltages are selected in any combination, the total of the voltages does not coincide with any of the remaining voltages or any total of the remaining voltages.

FIG. 8 is a graph exemplifying the case where the four voltages V1 to V4 are set to such values that even when a plurality of voltages are selected in any combination, the total of the voltages does not coincide with any of the remaining voltages or any total of the remaining voltages. FIG. 8 shows the case where the ratio of the voltages is V1:V2:V3:V4=1: 1.5:4.5:8. Even when voltages are selected in any combination from the voltages V1 to V4, the obtained voltage does not coincide with a voltage obtained by selecting another voltage or a voltage obtained by combining other voltages. As a result, the number of voltage levels that can be generated is increased up to 15 levels. In this manner, not only by simply varying the voltages V1 to V4 generated by the power supply unit 206 but also by setting the voltages to the values satisfying the above-described special relation (relation that even when a plurality of voltages are selected in any combination, the total of the voltages does not coincide with any of the remaining voltages or any total of the remaining voltages), the number of voltage levels that can be generated can be greatly increased.

Figure 9:
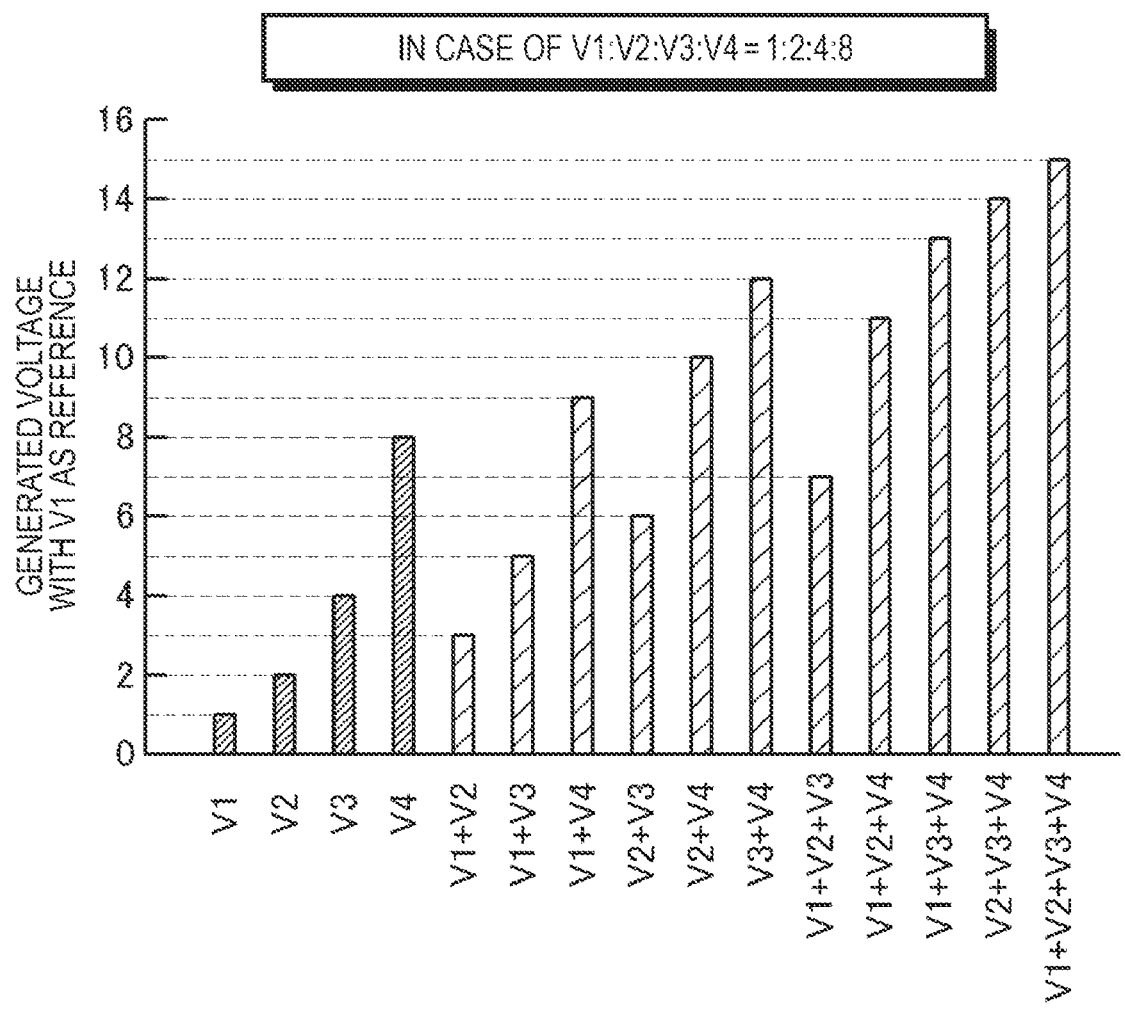
FIG. 9 is a graph showing a plurality of voltages that can be generated when the voltages V1 to V4 are set so as to satisfy the relation of $2^n$.

In the example shown in FIG. 8, however, the generated voltage values are not equally spaced. As shown in FIG. 9, therefore, the voltages V1 to V4 are desirably set so as to satisfy the relation of $2^n$ (n is an integer of 0 or more). That is, with the minimum voltage V1 as a reference, the voltage V2 is set to twice ($=2^1$) the voltage V1, the voltage V3 is set to four ($=2^2$) times the voltage V1, and the voltage V4 is set to eight ($=2^3$) times the voltage V1. When the voltages V1 to V4 generated by the power supply unit 206 are set in this manner, the voltages can be set to satisfy the above-described special relation (relation that even when a plurality of voltages are selected in any combination, the total of the voltages does not coincide with any of the remaining voltages or any total of the remaining voltages), and a plurality of voltages whose values are equally spaced from one another can be generated.

FIG. 9 is a graph showing a plurality of voltages obtained when the four voltages V1 to V4 are set so as to satisfy the relation of $2^n$. As shown in the drawing, in the case where the four voltages V1 to V4 are set to satisfy the relation of V1:V2: V3:V4=1:2:4:8, it is possible to generate such various voltages that do not coincide with a voltage obtained by selecting another voltage or a voltage obtained by combining other voltages even when the voltages are selected in any combination, similarly to the case of FIG. 8. In addition, the plurality of voltages obtained in this manner have values that are equally spaced from one another. In this manner, when the values of the plurality of voltages that can be generated are equally spaced from one another, a wide variety of voltage waveforms can be generated while enhancing the resolution of voltage change.

As described above, the voltages V1 to V4 generated by the power supply unit 206 of the drive waveform generator 204 of the embodiment are set so as to satisfy the relation of $2^n$. As shown in FIG. 9, therefore, the plurality of voltages whose values are equally spaced from one another can be generated. Compared to the case where the voltages V1 to V4 are all set to the same voltage as shown in FIG. 7A, a voltage range that can be generated can be greatly (about four times) expanded while keeping the respective spaces between the generated voltage values equal to one another. Assuming that, as shown in FIG. 7A, it is desired to generate the same degree of kinds of voltages and to obtain the same degree of voltage range as in FIG. 9 while a voltage charged to a capacitor remains the same, it is necessary to increase the number of capacitors to about four times. An increase in the number of capacitors increases the size of the circuit in proportional to the increase. Conversely, it can be said that the drive waveform generator 204 of the embodiment is a small circuit for the kinds of voltages that can be generated and the voltage range. When all the increased kinds of voltages that can be generated are not allocated for the expansion of voltage range but a part of the kinds is allocated for the improvement of the resolution, the resolution of voltage change can be improved while expanding the voltage range.

As described above, in the drive waveform generator 204 of the embodiment, the description is made based on the premise that the power supply unit 206 generates the voltages satisfying the relation of $2^i$. However, the plurality of voltages generated by the power supply unit 206 do not necessarily satisfy the relation of $2^n$. As exemplified in FIG. 8 for example, all voltages may be different, and the voltages may be set so as to satisfy the relation that even when a plurality of voltages are selected in any combination from the voltages, the total of the voltages does not coincide with any of the remaining voltage or any total of the remaining voltages. Alternatively, as exemplified in FIG. 7B, it is sufficient to only vary the plurality of voltages generated by the power supply unit 206. Also in such a case, compared to the case where all the voltages are set the same as shown in FIG. 7A, the kinds of voltages that can be generated can be greatly increased, and a voltage range can be greatly expanded.

B-3. Method for Generating Drive Waveform

In the above, the configuration of the drive waveform generator 204 of the embodiment, and the reason why the drive waveform generator 204 can generate a plurality of voltages have been described. The ejection head driving circuit 200 of the embodiment uses the drive waveform generator 204 to generate a drive waveform as described below.

Figure 10:
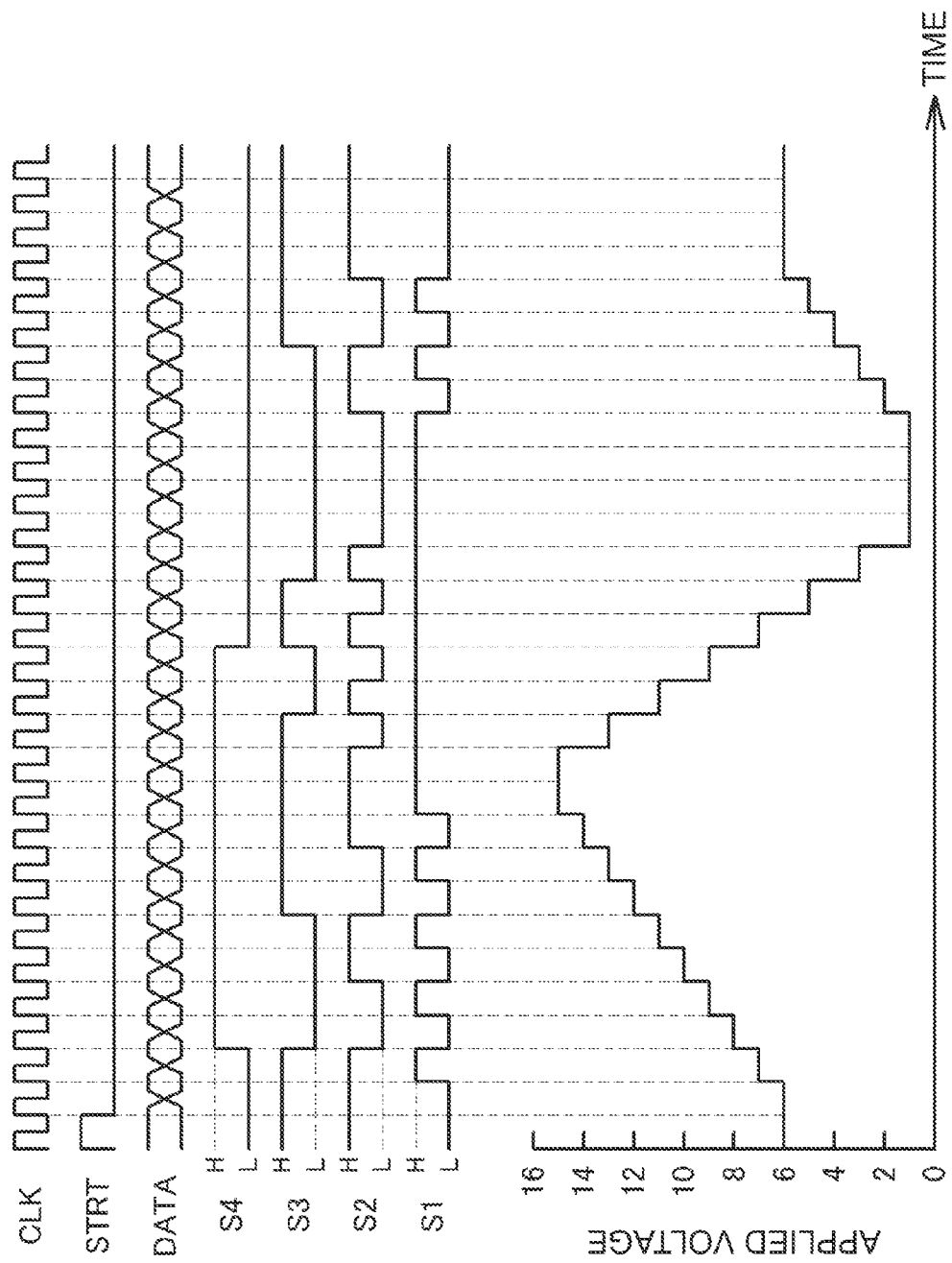
FIG. 10 is a timing chart showing a state where the ejection head driving circuit generates a drive waveform under the control of a printer control circuit.

FIG. 10 is a timing chart showing a state where the ejection head driving circuit 200 of the embodiment generates a drive waveform under the control of the printer control circuit 50. The ejection head driving circuit 200 of the embodiment receives from the printer control circuit 50 a clock signal indicated as "CLK" in the drawing, a start signal indicated as "STRT" in the drawing, and waveform data indicated as "DATA" in the drawing to generate a drive waveform, and thereafter outputs the generated drive waveform to the piezo element 104. In the waveform data, data indicating to which of the H state and the L state the switches S1 to S4 disposed in the drive waveform generator 204 are switched. As shown in FIG. 6A for example, when the switch S4 and the switch S3 are set to the L state, and the switch S2 and the switch S1 are set to the H state, data of "0011" (representing the states of the switch S4, the switch S3, the switch S2, and the switch S1 from the left, with 0 representing the L state and 1 the H state; the same applies hereinafter) is set. As shown in FIG. 6B, when the switch S4 is set to the H state, the switch S3 is set to the L state, the switch S2 is set to the H state, and the switch S1 is set to the L state, data of "1010" is set. Accordingly, when data to be output is switched according to a clock signal, the connection states of the switches S1 to S4 are switched with the switching of the data. Therefore, an arbitrary drive waveform can be generated.

In a memory of the printer control circuit 50, a plurality pieces of data indicating the connection states of the switches S1 to S4 are stored as waveform data in a state of being arranged in the output order. When a drive waveform is output to the piezo element 104, after a start signal is output from the printer control circuit 50 to the ejection head driving circuit 200, the waveform data stored in the memory is read out, and each piece of the data constituting the data set is output to the ejection head driving circuit 200 in synchronization with a clock signal.

FIG. 11 is a table exemplifying waveform data stored in the memory of the printer control circuit 50. In the waveform data, a plurality pieces of data indicating the connection states of the switches S1 to S4 are stored in the state of being arranged in the output order. In the table, the data indicating the connection states of the switches S1 to S4 is expressed in the decimal system. In FIG. 11, count values are shown on the left of the data, while the connection states of the switches S1 to S4 indicated by the data are shown on the right of the data. For example, data of "6" in the decimal expression is stored as the first data (data of a count value 0) of the waveform data. The data indicates that the switch S4 is set to the L state, the switch S3 and the switch S2 are set to the H state, and the switch S1 is set to the L state.

In the memory of the printer control circuit 50, a plurality kinds of the waveform data are previously stored. After selecting one of the plurality pieces of waveform data and outputting a start signal, the printer control circuit 50 reads out the plurality pieces of data constituting the waveform data one by one and outputs the read data to the ejection head driving circuit 200 in synchronization with a clock signal. From the ejection head driving circuit 200, a drive waveform corresponding to the selected waveform data is output.

In the ejection head driving circuit 200 of the embodiment as described above, for driving the piezo element 104 as an electrical load having a capacitive component (capacitive load), the connection states of a plurality of capacitors are switched to generate a drive waveform. These capacitors are previously charged with different voltages. Therefore, compared to the case of charging all the capacitors with the same voltage, the kinds of voltages that can be output can be increased (that is, the resolution of voltage change can be improved), and also a voltage range that can be output can be expanded.

In addition, the voltages of the capacitors are not only simply different but also set so as to satisfy a special relation (relation that even when a plurality of voltages are selected in any combination, the total of the voltages does not coincide with any of the remaining voltages or any total of the remaining voltages). As the voltages having the special relation, a plurality of voltages are especially set so as to be $2^n$ times the minimum voltage. Therefore, compared to the case of charging all the capacitors with the same voltage, the kinds of voltages that can be output can be greatly increased, and also a voltage range that can be output can be greatly expanded. Since these things can be realized without increasing the number of capacitors, it is also possible to miniaturize the circuit.

C. Modified Examples

There are various modified examples of the above-described ejection head driving circuit 200 of the embodiment. The modified examples will be briefly described below. In the modified examples described below, the constituent elements similar to those in the above-described embodiment are denoted by the same reference numerals and signs as in the embodiment, and the detailed description thereof is omitted.

C-1. First Modified Example

In the drive waveform generator 204 of the above-described embodiment, as switches for switching the connection states of the capacitors C2 to C4, the switches S1 to S4 that can switch between the H state and the L state are used. On the other hand, switches that can switch between the conductive state (ON state) and the disconnected state (OFF state) may be combined for use.

Figure 12:
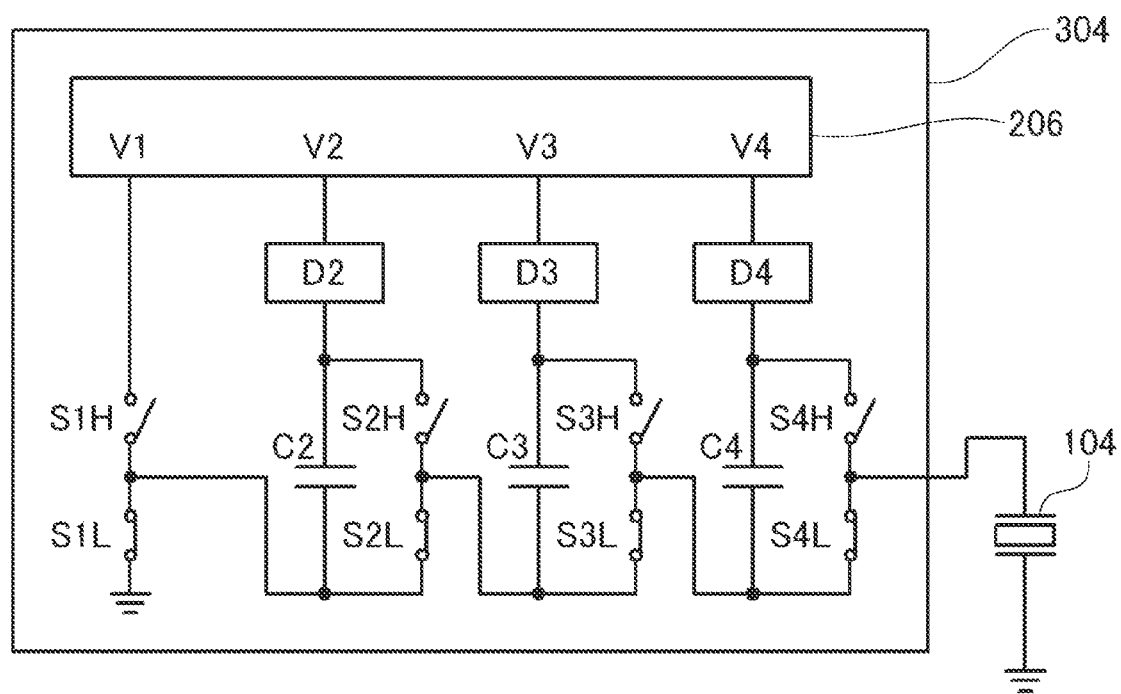
FIG. 12 is an explanatory view showing the circuit configuration of a drive waveform generator of a first modified example.

FIG. 12 is an explanatory view showing the circuit configuration of a drive waveform generator 304 of a first modified example. In the drive waveform generator 304 of the first modified example, the switch S1 is replaced by a switch S1H and a switch S1L compared to the drive waveform generator 204 of the embodiment described with reference to FIG. 3. Similarly, the switch S2 is replaced by a switch S2H and a switch S2L, the switch S3 is replaced by a switch S3H and a switch S3L, and the switch S4 is replaced by a switch S4H and a switch S4L. Also with the drive waveform generator 304 of the first modified example, the connection states of the capacitors C2 to C4 can be switched similarly to the above-described drive waveform generator 204. For example, in the case where the switch S1 is switched to the H state in the drive waveform generator 204, the switch S1H is brought into the ON state, and the switch S1L is brought into the OFF state in the drive waveform generator 304. Conversely, in the case where the switch S1 of the drive waveform generator 204 is switched to the L state, the switch S1H is brought into the OFF state, and the switch S1L is brought into the ON state in the drive waveform generator 304.

In the drive waveform generator 304 of the first modified example, since a more typical switching element that can switch between the ON state and the OFF state can be used, the circuit can be configured more simply.

C-2. Second Modified Example

In the above-described embodiment, a plurality of power supply circuits that generate different voltages are incorporated in the power supply unit 206. Actually, however, it is sufficient that the power supply unit 206 can generate different voltages. One power supply circuit may generate a plurality of voltages different from one another.

Figure 13A:
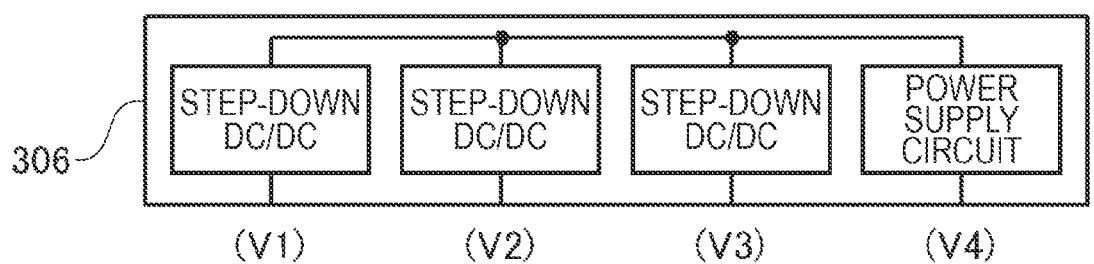
FIGS. 13A to 13C are explanatory views exemplifying a power supply unit of a second modified example that generates a plurality of voltages from one power supply circuit.
Figure 13B:
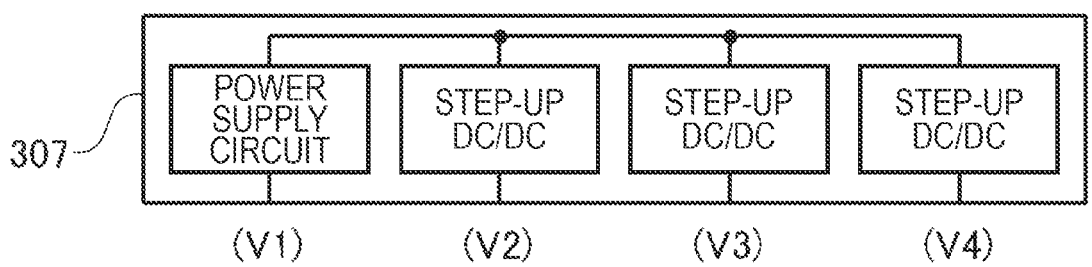
Figure 13C:
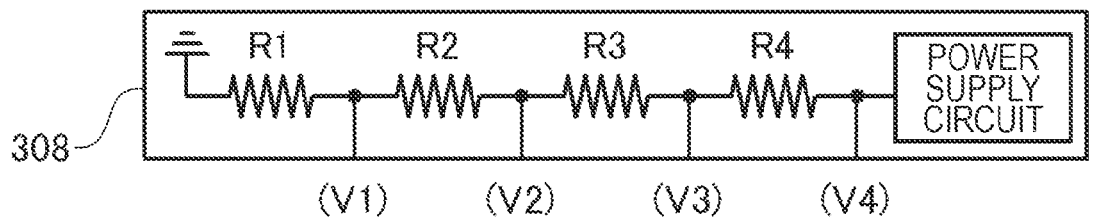

FIGS. 13A to 13C are explanatory views exemplifying a power supply unit of a second modified example that generates a plurality of voltages from one power supply circuit. For example, like a power supply unit 306 shown in FIG. 13A, a power supply circuit that generates the highest voltage V4 is incorporated, and the voltage generated by the power supply circuit is supplied to step-down DC/DC converters, whereby the plurality of voltages V1 to V3 of different voltages may be generated. Conversely, like a power supply unit 307 shown in FIG. 13B, a power supply circuit that generates the lowest voltage V1 is incorporated, and the voltage generated by the power supply circuit is supplied to step-up DC/DC converters, whereby the plurality of voltages V2 to V4 of different voltages may be generated. Further as exemplified in FIG. 13C, a power supply circuit generates the highest voltage V4, and the voltage is divided by a plurality of resistances R1 to R4, whereby the plurality of voltages V1 to V3 of different voltages may be generated. By combining them, for example, by using a step-down DC/DC converter and a step-up DC/DC converter, a voltage lower than and a voltage higher than a voltage generated by a power supply circuit can also be generated.

C-3. Third Modified Example

In the above-described embodiment and modified examples, the voltages V1 to V4 generated by the power supply units 206 and 306 are fixed. However, the voltages V1 to V4 may be changed according to the driving conditions of the piezo element 104.

Figure 14:
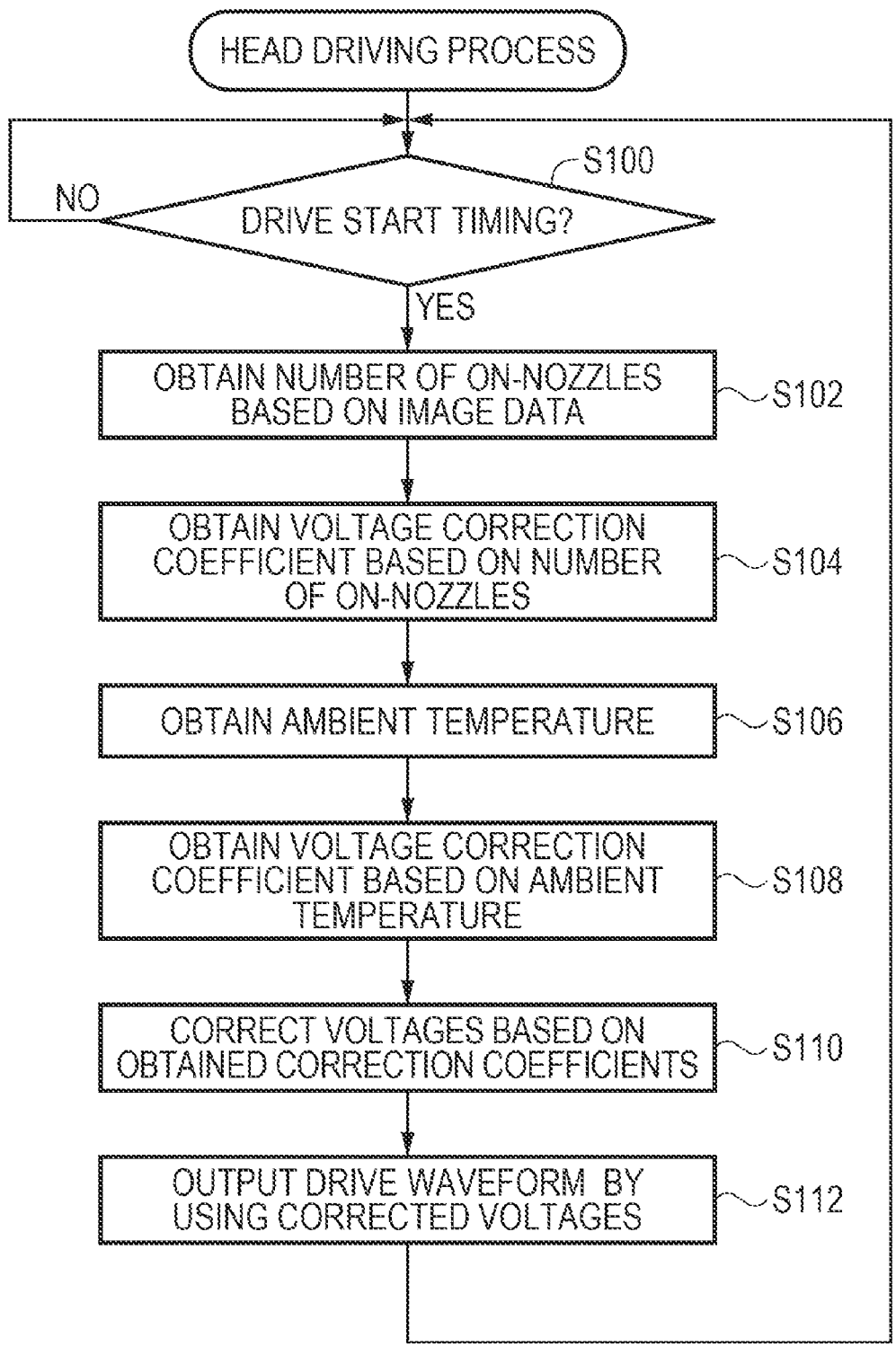
FIG. 14 is a flowchart showing a head driving process of driving an ejection head while changing the voltages V1 to V4 according to the driving conditions of a piezo element.

FIG. 14 is a flowchart showing a head driving process of driving the ejection head 24 while changing the voltages V1 to V4 according to the driving conditions of the piezo element 104. The process is executed by a CPU mounted on the printer control circuit 50.

When the head driving process is started, the CPU of the printer control circuit 50 first determines whether or not it is a drive start timing for the ejection head 24 (step S100). As described above with reference to FIG. 1, since the printer control circuit 50 controls the operation of making the carriage 20 reciprocate, the operation of feeding the print medium, and the operation of the ejection head driving circuit 200 that drives the ejection head 24, the printer control circuit 50 can determine the timing for starting the drive of the ejection head 24. When it is determined that it is not yet the drive start timing (step S100: no), the printer control circuit 50 is in a standby state while repeating the determination until the drive start timing.

On the other hand, when it is determined that it is the drive start timing (step S100: yes), the printer control circuit 50 obtains the number of ON-nozzles based on image data desired to be printed (step S102). In this case, the "image data" is image data indicating whether or not the inkjet printer 10 forms a dot, which has been subjected to a halftoning process (binarization process). The "number of ON-nozzles" is the number of nozzles that eject ink by driving the piezo element 104. At step S102, the number of dots to be formed in a unit time is calculated based on the image data to obtain the number of ON-nozzles. As described above with reference to FIG. 2, although the plurality of nozzles 100 are disposed in the ejection head 24, all the nozzles 100 do not always eject ink. A drive waveform is supplied to the piezo element 104 of the nozzle 100 via the gate element 302 of the gate unit 300. Only the piezo element 104 to which the gate element 302 is electrically conducted is driven to eject ink from the corresponding nozzle 100. The printer control circuit 50 controls which of the gate elements 302 is brought into the conductive state. The printer control circuit 50 can immediately obtain the number of ON-nozzles (that is, the number of the gate elements 302 to be set to the conductive state).

Subsequently, based on the obtained number of ON-nozzles, a correction coefficient for correcting the voltages V1 to V4 is obtained (step S104). That is, as the number of ON-nozzles increases, the number of the piezo elements 104 to be driven simultaneously increases. The increase in the number of the piezo elements 104 to be driven is the equivalent of an increase in capacitive component of an electrical load. Therefore, more charges have to be supplied for increasing a voltage by the same amount. For enabling the immediate supply of charge even in this case to immediately increase a voltage, the voltages V1 to V4 are changed to slightly higher levels.

Figure 15:
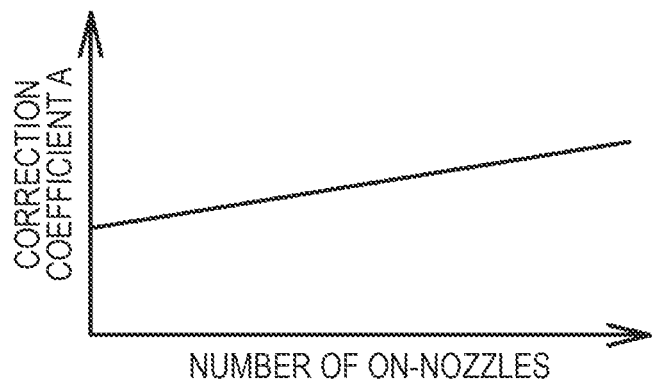
FIG. 15 is a graph showing a voltage correction coefficient A with respect to the number of ON-nozzles.

FIG. 15 is a graph showing a voltage correction coefficient A with respect to the number of ON-nozzles. In the printer control circuit 50 of the third modified example, a table indicating such a correspondence relation is previously stored in the memory. At step S104 in FIG. 14, a process of obtaining the correction coefficient A corresponding to the number of ON-nozzles is performed with reference to the table.

After the correction coefficient A corresponding to the number of ON-nozzles is obtained in this manner, the ambient temperature of the inkjet printer 10 is next obtained (step S106). In the printer control circuit 50 of the third modified example, since a temperature sensor is also mounted, the ambient temperature of the inkjet printer 10 can also be obtained.

Based on the obtained ambient temperature, a correction coefficient for correcting the voltages V1 to V4 is obtained (step S108). That is, as the ambient temperature of the inkjet printer 10 increases, the viscosity of ink decreases. Therefore, the ejection amount of ink tends to increase. For correcting the fluctuation of the ejection amount of ink due to the ambient temperature, when the ambient temperature increases, the voltages V1 to V4 are changed to slightly lower levels.

Figure 16:
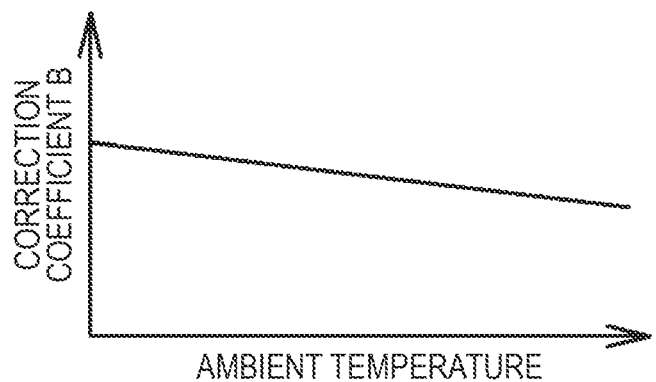
FIG. 16 is a graph showing a voltage correction coefficient B with respect to ambient temperature.

FIG. 16 is a graph showing a voltage correction coefficient B with respect to the ambient temperature. In the printer control circuit 50 of the third modified example, also a table indicating such a correspondence relation is previously stored in the memory. At step S108 in FIG. 14, a process of obtaining the correction coefficient B corresponding to the ambient temperature is performed with reference to the table.

After the correction coefficient A corresponding to the number of ON-nozzles and the correction coefficient B with respect to the ambient temperature are obtained as described above, the voltages V1 to V4 are corrected based on the correction coefficients (step S110). For correcting the voltages V1 to V4, various ways are possible.

Figure 17:
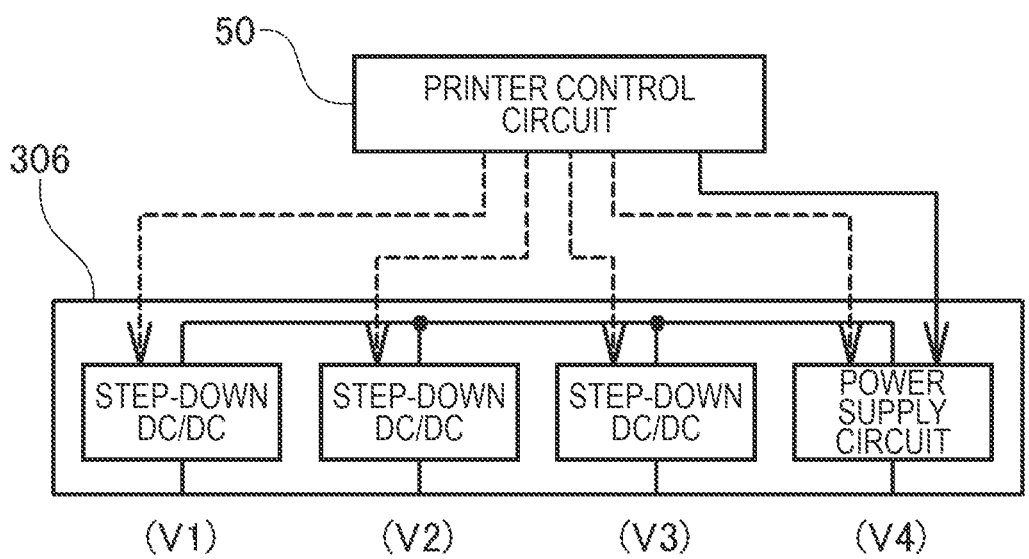
FIG. 17 is an explanatory view exemplifying various kinds of modes of correcting the voltages V1 to V4 using, by way of example, a power supply unit that is configured of a power supply circuit and step-down DC/DC converters.

FIG. 17 is an explanatory view exemplifying various kinds of modes for correcting the voltages V1 to V4 using, by way of example, the power supply unit 306 that is configured of the power supply circuit and the step-down DC/DC converters. A solid arrow shown in the drawing indicates the case where the voltages V1 to V4 are corrected in a single uniform way by correcting a voltage generated by the power supply circuit. For example, after the correction coefficient A and the correction coefficient B are multiplied to produce one correction coefficient, the generated voltage of the power supply circuit is corrected based on the correction coefficient, whereby the voltages V1 to V4 can be corrected by an extremely simple configuration.

Alternatively, as indicated by broken arrows in the drawing, the voltages V1 to V4 may be individually corrected. For example, for the highest voltage V4 (and the lowest voltage V1), the correction may be made such that the correction coefficient B contributes more than the correction coefficient A does, and for the other voltages (the voltage V2 and the voltage V3), the correction may be made such that the correction coefficient A contributes more than the correction coefficient B does. It is found that the maximum voltage (or the voltage difference between the maximum voltage and the minimum voltage) largely affects on the ejection amount of ink but the other voltages do not affect so much. For immediately supplying charge to the piezo element 104, on the other hand, the intermediate voltage V2 or V3 is set to a higher level, whereby a sufficient effect can be conceivably obtained. In view of this, when the correction is made by varying the contribution degree of the correction coefficient A and the correction coefficient B for each of the voltages V1 to V4, the correction can be made more properly. After the voltages V1 to V4 are corrected in this manner, a drive waveform is next output by using the corrected voltages to drive the ejection head 24 (step S112). Thereafter returning to step S100, it is determined whether or not it is the drive start timing of the ejection head 24.

While the various embodiment and modified examples have been described, the invention is not limited to the embodiment and modified examples. The invention can be implemented in various aspects within a range not departing from the gist thereof. For example, although a capacitive load to be driven has been described as the piezo element 104, any load is applicable without limiting to the piezo element 104 as long as it has a capacitive component. For example, even when various kinds of display devices such as liquid crystal panels or organic EL display devices are driven as loads, the invention can be suitably applied.

What is claimed is:

1. A capacitive load driving circuit that drives a capacitive load, comprising:
    a power supply unit that generates a first voltage and a second voltage larger than the first voltage;
    a first charge storage element that is charged with the first voltage;
    a second charge storage element that is charged with the second voltage; and
    a load driving section that connects at least one of the first charge storage element and the second charge storage element to the capacitive load to drive the capacitive load, and connects, when the first charge storage element and the second charge storage element are connected to the capacitive load, the first charge storage element and the second charge storage element to the capacitive load in a state where the first charge storage element and second charge storage element are connected in series.

2. The capacitive load driving circuit according to claim 1, wherein
    a back-flow preventing unit that prevents the back flow of charge from the first charge storage element and the second charge storage element to the power supply unit is disposed between the power supply unit and each of the first charge storage element and the second charge storage element.

3. The capacitive load driving circuit according to claim 1, wherein
    the power supply unit generates a third voltage larger than the second voltage, the capacitive load driving circuit further comprising:
    a third charge storage element that is charged with the third voltage wherein,
    the load driving section connects at least one of the first charge storage element to the third charge storage element to the capacitive load to drive the capacitive load, and connects, when at least two of the first charge storage element to the third charge storage element are connected to the capacitive load, the at least two charge storage elements to the capacitive load in a state where the at least two charge storage elements to be connected are connected in series, and
    a total voltage of the first voltage and the second voltage does not coincide with the third voltage.

4. The capacitive load driving circuit according to claim 3, wherein
    the power supply unit generates a fourth voltage larger than the third voltage, the capacitive load driving circuit further comprising:
    a fourth charge storage element that is charged with the fourth voltage is wherein,
    the load driving section connects at least one of the first charge storage element to the fourth charge storage element to the capacitive load to drive the capacitive load, and connects, when at least two of the first charge storage element to the fourth charge storage element are connected to the capacitive load, the at least two charge storage elements to the capacitive load in a state where the at least two charge storage elements to be connected are connected in series, and
    any of a total voltage of the first voltage and the second voltage, a total voltage of the first voltage and the third voltage, a total voltage of the second voltage and the third voltage, and a total voltage of the first voltage to the third voltage does not coincide with the fourth voltage, and a total voltage of the first voltage and the fourth voltage does not coincide with the total voltage of the second and third voltages.

5. The capacitive load driving circuit according to claim 4, wherein
    the second voltage to the fourth voltage are voltages 2n (n is a natural number) times the first voltage.

6. A liquid ejection device comprising:
    the capacitive load driving circuit according to claim 1;
    a nozzle that ejects liquid; and
    an actuator that is connected to the capacitive load driving circuit as the capacitive load and driven by the capacitive load driving circuit to eject liquid from the nozzle.

7. A printing apparatus comprising the liquid ejection device according to claim 6.

* * * * *